United States Patent [19]

Johnson et al.

[11] Patent Number: 5,049,454
[45] Date of Patent: Sep. 17, 1991

[54] MONOCRYSTALLINE MNZN-FERROFERRITE MATERIAL HAVING A HIGH CONTENT OF ZN, AND A MAGNETIC HEAD MANUFACTURED FROM SAID MATERIAL

[75] Inventors: Mark T. Johnson; Johannes F. M. Cillessen, both of Eindhoven; Johannes A. Pistorius, Erp, all of Netherlands

[73] Assignee: U.S. Philips Corporation, New York, N.Y.

[21] Appl. No.: 368,747

[22] Filed: Jun. 20, 1989

[30] Foreign Application Priority Data

Jul. 4, 1988 [NL] Netherlands ......................... 8801685

[51] Int. Cl.$^5$ ................................................ B32B 9/00
[52] U.S. Cl. ..................................... 428/692; 428/694; 428/900; 360/122; 360/125; 360/127
[58] Field of Search ........................ 360/122, 125, 127; 428/692, 694, 900

[56] References Cited

U.S. PATENT DOCUMENTS 4,331,548 5/1982 Yorizumi et al. .................. 360/127
4,568,993 2/1986 Stoppels et al. .................... 360/125

FOREIGN PATENT DOCUMENTS 092999 5/1984 Japan .
054009 3/1986 Japan .
119713 6/1987 Japan .

Primary Examiner—Merrell C. Cashion, Jr.
Assistant Examiner—Robert J. Follett
Attorney, Agent, or Firm—Norman N. Spain

[57] ABSTRACT

Monocrystalline MnZn-ferroferrite material having a high Zn-content, and magnetic head comprising the said material.

A monocrystalline MnZn-ferroferrite material for use in a magnetic head is described. The material corresponds to the formula $$Mn_aZn_bFe_c^{II}Fe_2^{III}O_4,$$

wherein
  $0.25 < a < 0.48$;
  $0.50 < b < 0.60$;
  $0.02 < c < 0.15$;
  $a + b + c = 1$.

The magnetostriction constants of this material are particularly small.

4 Claims, 1 Drawing Sheet

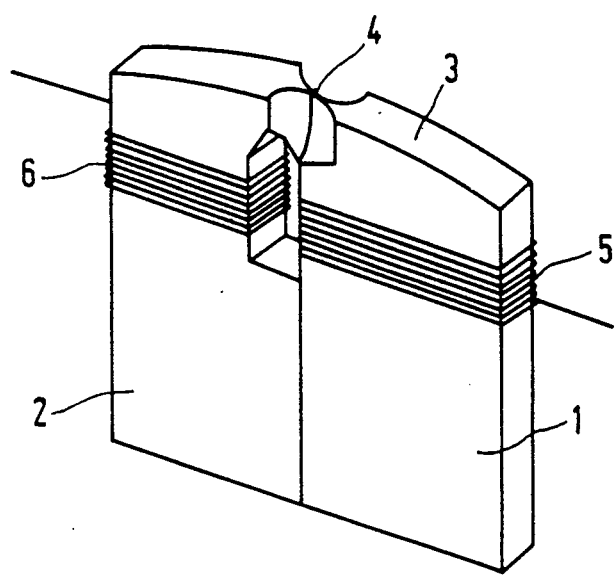

MONOCRYSTALLINE MNZN-FERROFERRITE MATERIAL HAVING A HIGH CONTENT OF ZN, AND A MAGNETIC HEAD MANUFACTURED FROM SAID MATERIAL

BACKGROUND OF THE INVENTION

The invention relates to a monocrystalline MnZn-ferroferrite material particularly suitable for use in a magnetic head. The invention also relates to a magnetic head manufactured from this material. This type of magnetic head is used for recording, erasing and playing-back information, for example, in audio and video apparatus.

MnZn-ferroferrite material is known from European Patent Application, publication number 86005. The magnetic material described in this European Application corresponds to the formula $$Mn_aZn_bFe_c^{II}Fe_2^{III}O_4,$$

wherein
$0 \leq a < 0.55$;
$0.06 \leq b < 0.4$ and
$0.25 \leq c < 0.9$
while it further holds that $a+b+c=1$. This known material has a number of good soft-magnetic properties, for example, a high saturation magnetization $B_s$ and a high magnetic permeability $\mu$. It has been established, however, that this material suffers from the disadvantage that the absolute value of the two magnetostriction constants $\lambda_{100}$ and $\lambda_{111}$ is high ($\lambda_{111} > 15.10^{-6}$ and $\lambda_{100} < -5.10^{-6}$). The magnetostriction contributes to the so-called "rubbing noise" via the inverse magnetostriction effect. This contribution to the rubbing noise is proportional to the magnitude of the absolute values of the magnetostriction constants. The frequency-dependent rubbing noise is considerable in the MHz-range. Video heads are used in said frequency range (4-30 MHz).

SUMMARY OF THE INVENTION

It is an object of the invention to provide a monocrystalline MnZn-ferroferrite material the absolute values of the two magnetostriction constants of which are as small as possible, and are preferably substantially zero. Another object of the invention is to provide a monocrystalline MnZn-ferroferrite having a sufficiently high permeability in the MHz-range. A further object of the invention is to provide a monocrystalline MnZn-ferroferrite material which has a sufficiently high saturation magnetization.

These and other objects are achieved by means of the magnetic material mentioned in the opening paragraph which is characterised according to the invention in that the material corresponds to the formula $$Mn_aZn_bFe_c^{II}Fe_2^{III}O_4,$$

wherein
$0.25 < a < 0.48$;
$0.50 < b < 0.60$;
$0.02 < c < 0.15$;
$a+b+c=1$.

The magnetostriction constants $\lambda_{100}$ and $\lambda_{111}$ of the material according to the invention both have an absolute value which is smaller than or equal to $5.10^{-6}$. The saturation magnetization and the permeability of the said materials are amply sufficient for use in magnetic heads.

The Zn-content in the material according to the invention is of particular importance. If this content is higher than the above-recited upper limit of 0.6, materials are obtained the saturation magnetization of which is considerably lower than in the materials according to the invention. In the case in which the Zn-content is lower than the above-recited lower limit of 0.5, it appears that the absolute value of at least one of the two magnetostriction constants $\lambda_{100}$ and $\lambda_{111}$, and that in particular of $\lambda_{100}$, increases considerably compared with the material according to the invention.

It has been found that the Fe(II)-content is decisive of a number of important magnetic properties to a considerable extent. If the Fe(II)-content is smaller than 0.02, a material is obtained the Curie temperature ($T_c$) of which is relatively low, and in which the permeability $\mu$ and the saturation magnetisation $B_s$ are also smaller than those of the material according to the invention. In materials having an Fe(II)-content which is larger than 0.15, the permeability $\mu$ has been found to be considerably smaller than in the materials according to the invention, while furthermore the absolute value of $\lambda_{111}$ in this range increases considerably.

The Mn(II)-content of the compounds according to the invention is determined by both the Fe(II)-content and the Zn(II)-content in that the sum of the bivalent elements $(a+b+c)$ must be equal to 1.

BRIEF DESCRIPTION OF THE DRAWING

In the drawing the sole FIGURE shows a view, partly in section, of a magnetic head the core parts of which consists of a material of the invention.

DETAILED DESCRIPTION OF THE INVENTION

A preferred embodiment of the invention is characterised in that
$0.30 < a < 0.40$;
$0.50 < b < 0.55$;
$0.10 < c < 0.15$;
$a+b+c=1$.

It has been found that the highest saturation magnetizations $B_s$ are found in material compositions corresponding hereto.

Another preferred embodiment of the invention is characterised in that
$0.32 < a < 0.40$;
$0.57 < b < 0.60$;
$0.03 < c < 0.08$;
$a+b+c=1$.

It has been found that the absolute values of both magnetostriction constants are smallest in the material compositions corresponding hereto.

It is to be noted that it is surprising that in the MnZn-ferroferrites of a given composition the values of both magnetostriction constants simultaneously are substantially zero. It may be derived from FIGS. 6 and 7 of the article by Ohta as published in Jap. J. Appl. Phys. 3 (10) 576 (1964) that it is impossible in MnZn-ferroferrites to choose a composition in which both constants simultaneously are substantially zero. This prejudice is overcome by the present invention.

The invention will now be described in greater detail with reference to specific examples and the drawing.

SPECIFIC EXAMPLES

Single crystals of MnZn-ferroferrites having different compositions were manufactured by means of the Bridgman method known per se for these uses by melting the relevant metal oxides and/or carbonates, in a quantity which corresponds substantially to the indicated mol. fractions of the compound to be manufactured, at 1650° C. in an oxygen atmosphere and then crystallizing the melt. The growth direction of the crystals was [100], while the growth rate was 2 mm/hour. In this manner single crystals were obtained having a length of 6 cm and a diameter of 2 cm.

TABLE

| REF NR | a | b | c | $\lambda_{100}$ ($\times 10^6$) | $\lambda_{111}$ ($\times 10^6$) | $T_c$ (°C.) | $B_s$ (T) | $\mu$ eff (30° C.) 4 MHz | 10 MHz | 25 MHz | 50 MHz |
|---|---|---|---|---|---|---|---|---|---|---|---|
| 1 | 0.36 | 0.58 | 0.06 | −1.2 | 1 | 75 | 0.33 | 900 | 400 | 150 | 100 |
| 2 | 0.39 | 0.58 | 0.03 | −0.7 | 0.8 | 100 | 0.32 | 1100 | 500 | 230 | 120 |
| 3 | 0.30 | 0.57 | 0.13 | −1 | 5 | 130 | 0.42 | 1250 | 750 | 400 | 250 |
| 4 | 0.31 | 0.56 | 0.13 | −1.5 | 5 | 130 | 0.35 | 1000 | 600 | | |
| 5 | 0.32 | 0.56 | 0.12 | −1 | 4.5 | 130 | 0.33 | 1100 | 700 | 400 | 220 |
| 6 | 0.35 | 0.54 | 0.11 | −1.8 | 4.8 | 130 | 0.35 | 1100 | 800 | | |
| 7 | 0.38 | 0.52 | 0.10 | −2.2 | 3.8 | 125 | 0.38 | 1050 | 750 | 400 | 230 |
| 8 | 0.39 | 0.51 | 0.10 | −2.5 | 4 | 145 | 0.45 | 1100 | 700 | | |
| 9 | 0.38 | 0.62 | 0.00 | −0.4 | 1.2 | 50 | 0.21 | 500 | 200 | 70 | 40 |
| 10 | 0.43 | 0.48 | 0.10 | −4 | 4 | 155 | 0.41 | 1100 | 800 | 500 | 300 |
| 11 | 0.45 | 0.46 | 0.09 | −3.5 | 3 | 155 | 0.46 | 750 | 600 | 400 | 240 |
| 12 | 0.48 | 0.44 | 0.08 | −4.5 | 4 | 155 | 0.41 | 1200 | 700 | 500 | 280 |

In the table data are resisted twelve monocrystalline MnZn-ferroferrites manufactured according to this method. The reference numerals 1-8 indicate compositions of materials according to the invention, while the reference numerals 9-12 denote compositions of materials which do not belong to the invention and serve as comparative examples.

It will be obvious from the table that the absolute values of both magnetostriction constants are small to very small for the compounds according to the invention, namely even smaller than $1.10^{-6}$ (example 2). It may further be derived from the table that the highest saturation magnetizations are generally found in materials according to the invention in which $0.50 < b < 0.55$. As appears from the table, the lowest magnetostriction constants are found in those materials according to the invention in which $0.57 < b < 0.60$.

The material of comparative example 9 in which the Zn-content is comparatively high and the Fe(II)-content is comparatively low, shows magnetic properties such as a saturation magnetizations, a permeability and a Curie temperature which are considerably worse than those in the materials according to the invention. In the materials having reference numerals 10-12, in which the Zn-content is comparatively low, the absolute values of both magnetostriction constants appear to be comparatively high. This applies in particular to $\lambda_{100}$.

FIG. 1 shows a video head. It is constructed from two core parts 1, 2 of the material according to the invention. At the area of the gap 4 the tape contact surface is narrowed. Coils 5, 6 are wound around both core parts and a write, read or erase signal can be sent through said coils. The use of the magnetic material according to the invention, however, is not restricted to this type of magnetic head.

We claim:

1. A monocrystalline MnZn-ferroferrite material notably suitable for use in a magnetic head, characterised in that the material corresponds to the formula

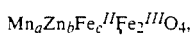
$$Mn_a Zn_b Fe_c{}^{II} Fe_2{}^{III} O_4,$$

wherein
 $0.25 < a < 0.48$;
 $0.50 < b < 0.60$;
 $0.02 < c < 0.15$;
 $a + b + c = 1$.

2. A monocrystalline MnZn-ferroferrite material as claimed in claim 1, characterised in that $0.30 < a < 0.40$;
 $0.50 < b < 0.55$;
 $0.10 < c < 0.15$;
 $a + b + c = 1$.

3. A monocrystalline MnZn-ferroferrite material as claimed in claim 1, characterised in that
 $0.32 < a < 0.40$;
 $0.57 < b < 0.60$;
 $0.03 < c < 0.08$;
 $a + b + c = 1$.

4. A magnetic head comprising at least a core part and a coil, characterised in that the core part consists of a monocrystalline MnZn-ferroferrite as claimed in claim 1.

* * * * *